(12) United States Patent
Kobune (10) Patent No.: US 12,165,850 B2
(45) Date of Patent: Dec. 10, 2024

(54) ELECTRODE FOR PLASMA PROCESSING APPARATUS AND PLASMA PROCESSING APPARATUS

(71) Applicant: Tokyo Electron Limited, Tokyo (JP)

(72) Inventor: Takaki Kobune, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 299 days.

(21) Appl. No.: 17/720,359

(22) Filed: Apr. 14, 2022

(65) Prior Publication Data

US 2022/0344127 A1    Oct. 27, 2022

(30) Foreign Application Priority Data

Apr. 21, 2021   (JP) .................................. 2021-071770

(51) Int. Cl.
*H01J 37/32*   (2006.01)
(52) U.S. Cl.
CPC .... *H01J 37/3255* (2013.01); *H01J 37/32082* (2013.01); *H01J 2237/06358* (2013.01)
(58) Field of Classification Search
CPC ........... H01J 37/32082; H01J 37/32541; H01J 37/3255; H01J 37/32091; H01J 2237/06358
See application file for complete search history.

(56) References Cited

U.S. PATENT DOCUMENTS

| 7,104,217 B2 * | 9/2006 | Himori ............. H01J 37/32082 156/345.43 |
| 2005/0211384 A1 * | 9/2005 | Hayashi ................ C23C 28/321 156/345.47 |
| 2005/0276928 A1 * | 12/2005 | Okumura ............ H01L 21/3065 427/446 |
| 2011/0162802 A1 | 7/2011 | Okumura et al. |
| 2011/0318934 A1 | 12/2011 | Wada et al. |
| 2012/0145324 A1 | 6/2012 | Koshiishi et al. |

FOREIGN PATENT DOCUMENTS

| JP | 2004-363552 A | 12/2004 |
| JP | 2011-049592 A | 3/2011 |
| JP | 2012-009624 A | 1/2012 |
| JP | 2020-109838 A | 7/2020 |

* cited by examiner

*Primary Examiner* — Yuechuan Yu
(74) *Attorney, Agent, or Firm* — XSENSUS LLP (57) ABSTRACT

An electrode for a plasma processing apparatus is provided. The electrode comprises: a first conductive member; and a second member disposed in the first member and made of a material having a secondary electron emission coefficient different from a secondary electron emission coefficient of the first member.

12 Claims, 6 Drawing Sheets

| Element | $\delta_{max}$ | $E_{max}$(eV) | $E_1$(eV) | $E_2$(eV) |
|---|---|---|---|---|
| Ag | 1.5 | 800 | 300 | >2000 |
| Al | 1.0 | 300 | 300 | 300 |
| Au | 1.4 | 800 | 150 | >2000 |
| B | 1.2 | 150 | 50 | 600 |
| Ba | 0.8 | 400 | None | None |
| Be | 1.2 | 550 | None | None |
| Bi | 0.5 | 200 | None | None |
| C (diamond) | 2.8 | 750 | 300 | >5000 |
| C (graphite) | 1.0 | 300 | None | 300 |
| C (soot) | 0.45 | 500 | 200 | 700 |
| Cd | 1.1 | 450 | None | None |
| Ce | 1.2 | 600 | 200 | 1500 |
| Co | 0.7 | 400 | 120 | 1400 |
| Cs | 1.3 | 600 | 75 | None |
| Fe | 1.3 | 400 | 150 | 900 |
| Ga | 1.55 | 500 | 150 | None |
| Ge | 1.15 | 500 | 250 | >1800 |
| Hg | 1.3 | 600 | None | None |
| K | 0.7 | 200 | None | None |
| Li | 0.5 | 85 | None | None |
| Mg | 0.95 | 300 | None | None |
| Mo | 1.25 | 375 | 150 | 1200 |
| Na | 0.82 | 300 | None | None |
| Nb | 1.2 | 375 | 150 | 1050 |
| Ni | 1.3 | 550 | 150 | >2500 |
| Pb | 1.1 | 600 | 250 | 1000 |
| Pd | >1.3 | >250 | 120 | 3000 |
| Pt | 1.8 | 700 | 350 | None |
| Rb | 0.9 | 350 | None | 2000 |
| Re | 1.3 | 600 | 250 | 500 |
| Si | 1.1 | 250 | 125 | None |
| Sn | 1.35 | 500 | None | >2000 |
| Ta | 1.3 | 600 | 250 | None |
| Th | 1.1 | 250 | None | None |
| Ti | 0.9 | 280 | None | >1500 |
| Tl | 1.7 | 650 | 70 | >1500 |
| W | 1.4 | 650 | 250 | None |
| Zr | 1.1 | 350 | None | None |

ELECTRODE FOR PLASMA PROCESSING APPARATUS AND PLASMA PROCESSING APPARATUS

CROSS-REFERENCE TO RELATED APPLICATION

This application claims priority to Japanese Patent Application No. 2021-071770 filed on Apr. 21, 2021, the entire contents of which are incorporated herein by reference.

TECHNICAL FIELD

The present disclosure relates to an electrode for a plasma processing apparatus, and a plasma processing apparatus.

BACKGROUND

For example, Japanese Patent Application Publication No. 2020-109838 discloses a parallel plate type capacitively coupled plasma processing apparatus. An upper electrode of the parallel plate type capacitively coupled plasma processing apparatus has an electrode plate facing a substrate support and exposed to a plasma space. The electrode plate is a single plate and is made of a single material of Si or SiC.

SUMMARY

The present disclosure provides a technique capable of controlling a plasma electron density.

To this end, an electrode for a plasma processing apparatus is provided, comprising: a first conductive member; and a second member disposed in the first member and made of a material having a secondary electron emission coefficient different from a secondary electron emission coefficient of the first member.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of the present disclosure will be described in detail with reference to the accompanying drawings. Like reference numerals will be given to like or corresponding parts throughout the drawings, and redundant description thereof may be omitted.

(Plasma Processing System)

Figure 1:
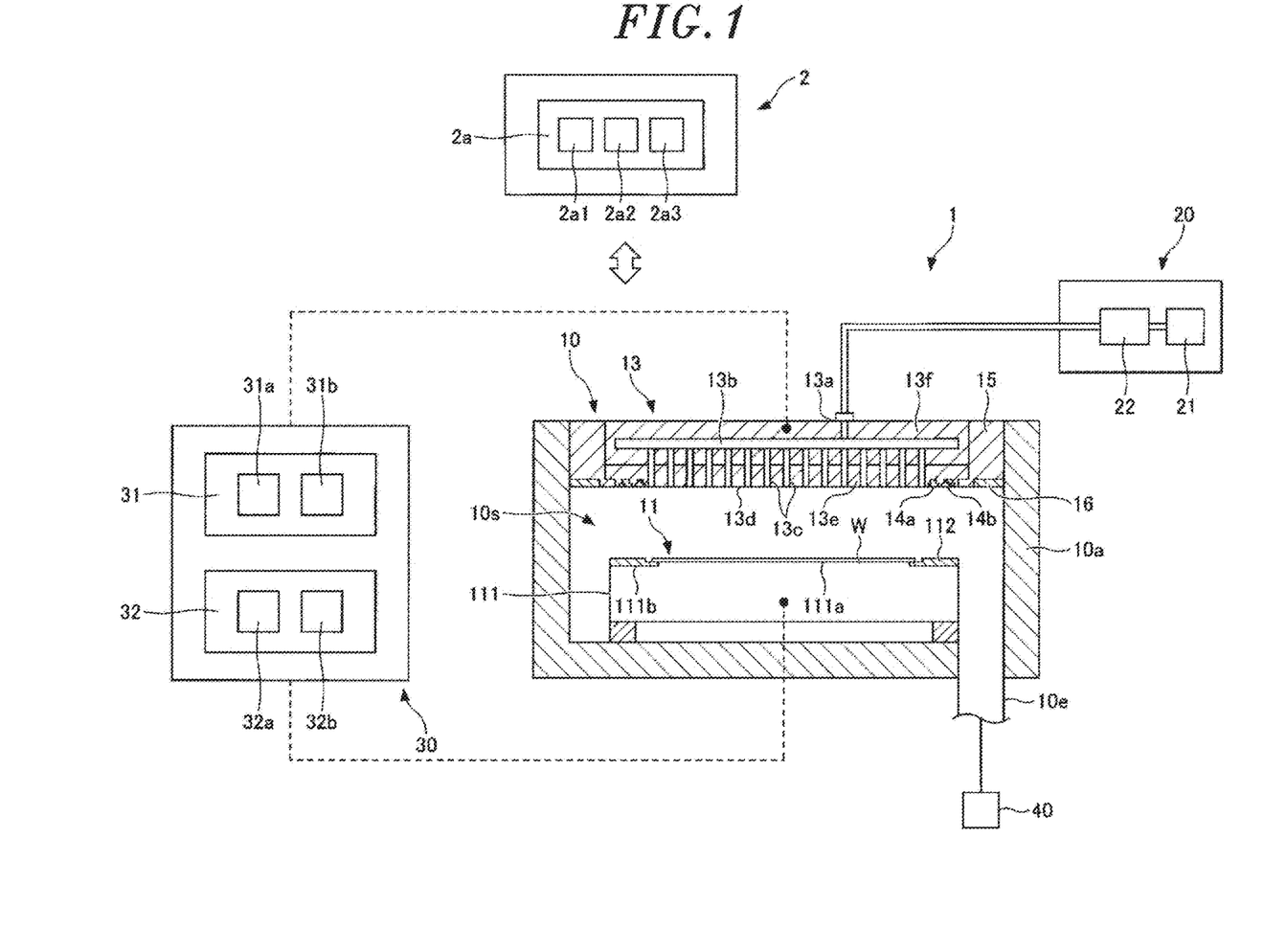
FIG. 1 shows a plasma processing system according to an embodiment.

Hereinafter, a configuration example of a Plasma processing system will be described with reference to FIG. 1.

The plasma processing system includes a capacitively coupled plasma processing apparatus 1 and a controller 2. The plasma processing apparatus 1 includes a plasma processing chamber 10, a gas supplier 20, a power supply 30, and an exhaust system 40. The plasma processing apparatus 1 further includes a substrate support 11 and a gas inlet portion. The gas inlet portion is configured to introduce at least one processing gas into the plasma processing chamber 10. The gas inlet portion includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space 10s defined by the shower head 13, a sidewall 10a of the plasma processing chamber 10, and the substrate support 11. The plasma processing chamber 10 has at least one gas supply port for supplying at least one processing gas to the plasma processing space 10s and at least one gas discharge port for discharging a gas from the plasma processing space. The sidewall 10a is grounded. The substrate support 11 is electrically isolated from the plasma processing chamber 10.

The substrate support 11 includes a main body 111 and a ring assembly 112. The main body 111 has a central region (substrate supporting surface) 111a for supporting a substrate (wafer) W and an annular region (ring supporting surface) 111b for supporting the ring assembly 112. The annular region 111b of the main body 111 surrounds the central region 111a of the main body 111 in plan view. The substrate W is disposed on the central region 111a of the main body 111, and the ring assembly 112 is disposed on the annular region 111b of the main body 111 to surround the substrate W on the central region 111a of the main body 111. In one embodiment, the main body 111 includes a base and an electrostatic chuck. The base includes a conductive member. The conductive member of the base functions as a lower electrode. The electrostatic chuck is disposed on the base. The upper surface of the electrostatic chuck has the substrate supporting surface 111a. The ring assembly 112 includes one or more annular members. At least one of them is an edge ring. Although not shown, the substrate support 11 may include a temperature control module configured to adjust at least one of the electrostatic chuck, the ring assembly 112, and the substrate to a target temperature. The temperature control module may include a heater, a heat transfer medium a flow path, or a combination thereof. A heat transfer fluid such as brine or a gas flows through the flow path. Further, the substrate support 11 may include a heat transfer gas supply configured to supply a heat transfer gas to a gap between the backside of the substrate N and the substrate supporting surface 111a.

The shower head 13 is configured to introduce at least one processing gas from the gas supplier 20 into the plasma processing space 10s. The shower head 13 has at least one gas supply port 13a, at least one gas diffusion space 13b, and a plurality of gas inlet ports 13c. The processing gas supplied to the gas supply port 13a passes through the gas diffusion space 13b and is introduced into the plasma processing space 10s from the Gas inlet ports 13c.

The shower head 13 has an electrode plate 13e and an electrode holder 13f for holding the electrode plate 13e. The electrode plate 13e functions as an electrode (upper electrode) for a plasma processing apparatus. An annular insulating member 15 is disposed around the electrode plate 13e and the electrode holder 13f, so that the upper electrode is electrically isolated from the plasma processing chamber 10. An annular ground member 16 is disposed below the insulating member 15.

The electrode plate 13e has a first member 13d facing the substrate support 11 and having a bottom surface exposed to the plasma processing space 10s, and second members 14a and 14b disposed in the first member 13d.

The gas inlet portion may include, in addition to the shower head 13, one or more side gas injectors (SGI) attached to one or more openings formed in the sidewall 10a.

The gas supplier 20 may include at least one gas source 21 and at least one flow rate controller 22. In one embodiment, the gas supplier 20 is configured to supply at least one processing gas from the corresponding gas source 21 to the shower head 13 through the corresponding flow rate controller 22. The flow rate controllers 22 may include, e.g., a mass flow controller or a pressure-controlled flow rate controller. Further, the gas supplier 20 may include one or more flow rate modulation devices for modulating the flow rate of at least one processing gas or causing it to pulsate.

The power supply 30 includes an RF power supply 31 connected to the plasma processing chamber 10 through at least one impedance matching circuit. The RF power supply 31 is configured to supply at least one RF signal (RF power), such as a source RF signal and a bias RF signal, to the conductive member of the substrate support 11 and/or the conductive member (the electrode plate 13e) of the shower head 13. Accordingly, plasma is produced from at least one processing gas supplied to the plasma processing space 10s. Hence, the RF power supply 31 may function as at least a part of a plasma generator configured to generate plasma from one or more processing gases in the plasma processing chamber 10. Further, by supplying the bias RF signal to the conductive member of the substrate support 11, a bias potential is generated at the substrate W, and ions in the produced plasma can be attracted to the substrate W.

In one embodiment, the RF power supply 31 includes a first RF generator 31a and a second PE generator 31b. The first RF generator 31a is connected to the conductive member of the substrate support 11 and/or the conductive member of the shower head 13 through at least one impedance matching circuit, to generate a source RF signal (source RF power) for plasma generation In one embodiment, the source RF signal has a frequency within a range of, e.g., 13 MHz to 150 MHz. In one embodiment, the first RF generator 31a may be configured to generate multiple source RF signals having different frequencies. One or multiple source RF signals so generated are supplied to the conductive member of the substrate support 11 and/or the conductive member of the shower head 13. The second RF generator 31b is connected to the conductive member of the substrate support 11 through at least one impedance matching circuit, and is configured to generate a bias RF signal (bias RF power). In one embodiment, the bias RF signal has a frequency lower than that of the source RE signal. In one embodiment, the bias PE signal has a frequency within a range of, e.g., 400 kHz to 13.56 MHz. In one embodiment, the second RF generator 31b may be configured to generate multiple bias RF signals having different frequencies. One or multiple bias RD signals so generated are supplied to the conductive member of the substrate support 11. In various embodiments, at least one of the source RD signal and the bias RD signal may pulsate.

The power supply 30 may include a DC power supply 32 connected to the plasma processing chamber 10. The DC power supply 32 includes a first DC generator 32a and a second DC generator 32b. In one embodiment, the first DC generator 32a is connected to the conductive member of the substrate support 11 and is configured to generate a first DC signal. The first bias DC signal so generated is applied to the conductive member of the substrate support 11. In one embodiment, the first DC signal may be applied to another electrode, such as an electrode in an electrostatic chuck. In one embodiment, the second DC generator 32b is connected to the conductive member of the shower head 13 and is configured to generate a second DC signal. The second DC signal so generated is applied to the conductive member of the shower head 13. In various embodiments, at least one of the first and second DC signals may pulsate. The first DC generator 32a and the second DC generator 32b may be provided in addition to the RD power supply 31, and the first DC generator 32a may be provided instead of the second RD generator 31b.

The exhaust system 40 may be connected to a gas outlet 10e disposed at a bottom portion of the plasma processing chamber 10, for example. The exhaust system 40 may include a pressure control valve and a vacuum pump. The pressure control valve adjusts a pressure in the plasma processing space 10s. The vacuum pump may include a turbo molecular pump, a dry pump, or a combination thereof.

The controller 2 processes computer-executable instructions that cause the plasma processing apparatus 1 to perform various steps described in the present disclosure. The controller 2 may be configured to control individual components of the plasma processing apparatus 1 to perform various steps described herein. In one embodiment, the controller 2 may be partially or entirely included in the plasma processing apparatus 1. The controller 2 may include, e.g., a computer 2a. The computer 2a may include, e.g., a central processing unit (CPU) 2a1, a storage device 2a2, and a communication interface 2a3. The CPU 2a1 may be configured to perform various control operations based on a program and recipe stored in the storage device 2a2. The storage device 2a2 may include a random access memory (RAM), a read only memory (ROM), a hard disk drive (HDD), a solid state drive (SSD), or a combination thereof. The communication interface 2a3 may communicate with the plasma processing apparatus 1 through a communication line such as a local area network (LAN) or the like.

(Electrodes for Plasma Processing Apparatus)

Figure 2A:
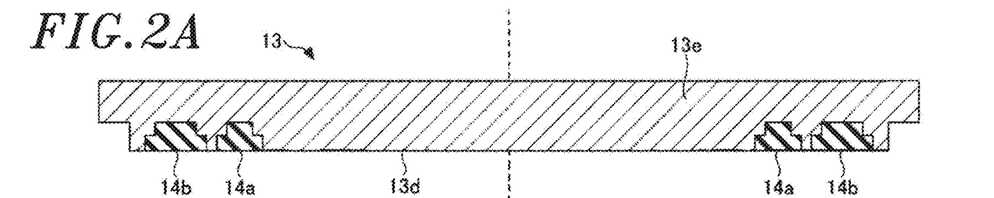
FIGS. 2A and 2B show examples of a cross section of an electrode plate according to an embodiment.
Figure 2B:
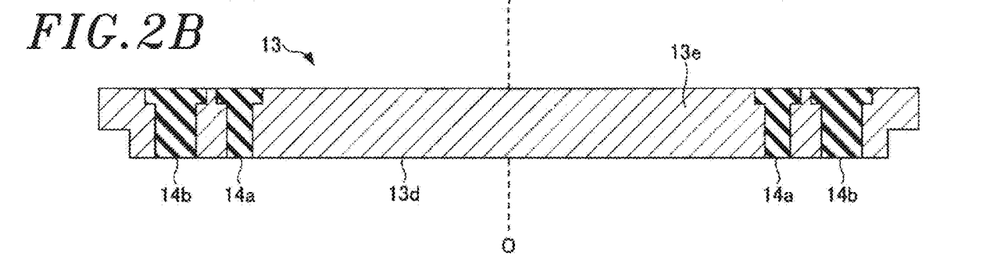
Figure 3A:
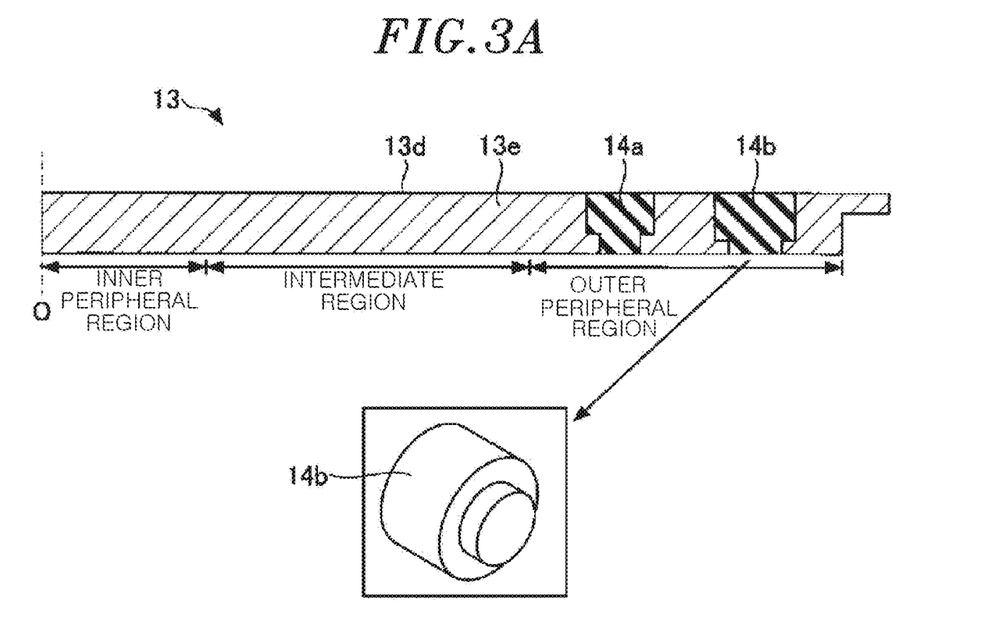
FIGS. 3A to 3C show examples of a cross section, an upper surface, and a bottom surface of the electrode plate according to the embodiment.
Figure 3B:
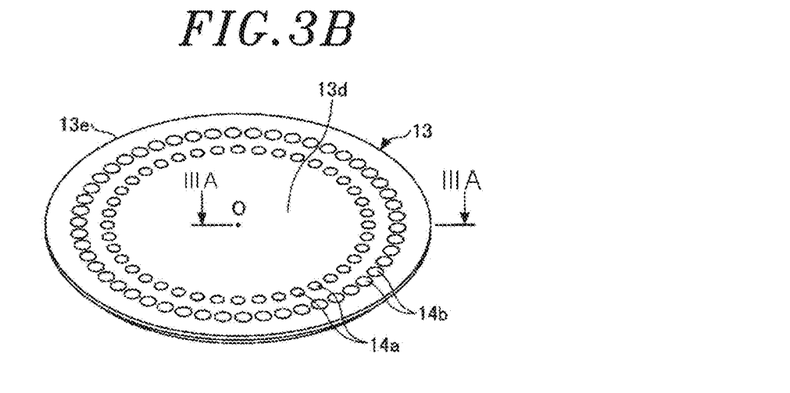

Next, a configuration of an electrode for the plasma processing apparatus according to the present embodiment will be described with reference to FIGS. 2 and 3. FIGS. 2 and 3A show examples of a cross section of the electrode plate 13e according to the embodiment. FIGS. 3B and 3D show examples of an upper surface and a bottom surface of the electrode plate 13e according to the embodiment.

Referring to FIGS. 2A and 2B, the first member 13d of the electrode plate 13e is a single plate having a disc shape about a central axis O, and is made of silicon as a conductive material. The first member 13d may be made of SiC. The bottom surface of the first member 13d is exposed to the plasma processing space 10s and is exposed to plasma.

The second members 14a and 14b are disposed in the first member 13d, and are made of a material having a secondary electron emission coefficient different from that of the first member 13d. In FIG. 2A, the second members 14a and 14b are joined or fitted into holes formed in a bottom surface of the first member 13d, and thus are fixed in the first member 13d. In FIG. 2B, the second members 14a and 14b are joined or fitted into through-holes formed in the first member 13d, and thus are fixed in the first member 13d. The second members 14a and 14b may be made of quartz.

The secondary electron emission coefficients of the second members 14a and 14b are greater than that of the first member 13d. The second members 14a and 14b are disposed in the electrode plate 13e, and the surfaces of the second members 14a and 14b are at least partially exposed to plasma.

In the examples of FIGS. 2A and 2B and 3A to 3C, the second members 14a and 14b are at least partially exposed to the plasma processing space 10s. In the example of FIG. 2A, the bottom surfaces of the second members 14a and 14b are exposed from the bottom surface of the first member 13d. In the examples of FIGS. 2B and 3A, the upper surfaces and the bottom surfaces of the second members 14a and 14b are exposed. from the bottom surface and the upper surface of the first member 13d, respectively.

The second members 14a and 14b have a cylindrical shape with a stepped portion. In the example of FIG. 2A, the second members 14a and 14b have upper diameters smaller than lower diameters. In the examples of FIGS. 2B and 3A, the second members 14a and 14b have upper diameters greater than lower diameters. Therefore, the second members 14a and 14b are not easily detached from the first member 13d. However, the second members 14a and 14b do not necessarily have such a shape, and may have a cylindrical shape without a stepped portion. As shown in FIG. 2A, the second members 14a and 14b may not completely penetrate the electrode plate 13e, and may have upper diameters greater than lower diameters. Further, as shown in FIG. 2B, the second members 14a and 14b may penetrate the electrode plate 13e, and may have upper diameters smaller than lower diameters.

Figure 3C:
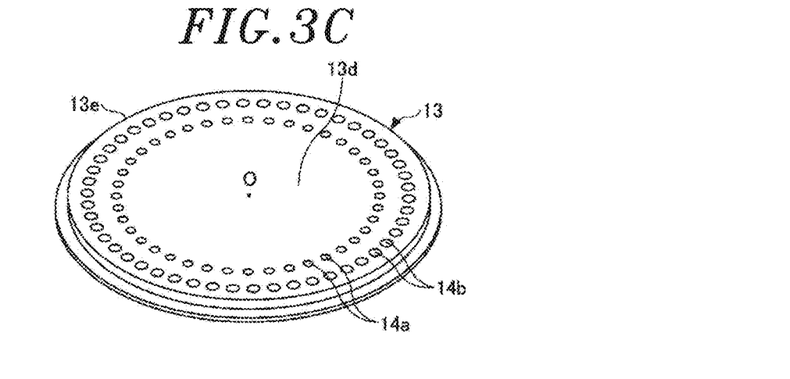

FIGS. 3B and 3C show examples of arrangement of the first member 13d and the second members 14a and 14b of the electrode plate 13e shown in FIG. 3A. FIG. 3B shows the upper surface of the electrode plate 13e. FIG. 3C shows an upside-down state of the electrode plate 13e and shows the bottom surface of the electrode plate 13e. FIG. 3A shows a cross section taken along a line IIIA-IIIA of FIG. 3B.

A plurality of second members 14a and 14b are disposed in the first member 13d and penetrate the first member 13d. The plurality of second member 14a and 14b are arranged at equal intervals. The plurality of second members 14a may be arranged at equal intervals in a circumferential direction. Similarly, the plurality of second members 14b may be arranged at equal intervals in the circumferential direction In the present disclosure, the first member 13d is radially divided into an inner peripheral region, an intermediate region, and an outer peripheral region in that order from the center, and the second members 14a and 14b are disposed in the outer peripheral region.

The inner peripheral region, the intermediate region, and the outer peripheral region correspond to the central (inner) region, the intermediate region, and the outer region of the first member 13d that are radially divided about the central axis O, respectively, as shown in FIG. 3A, for example. In the present disclosure, the second members 14a and 14b are disposed in the outer peripheral region However, the second members 14a and 14b are not necessarily disposed in the outer peripheral region, and may be disposed in at least one of the inner peripheral region, the intermediate region, and the outer peripheral region depending on characteristics of electron density distribution of the plasma generated in the plasma processing space 10s.

The second members 14a and 14b are not necessarily arranged in two concentric circles at equal intervals in the circumferential direction. The second members 14a and 14b may be arranged in a single circle or three or more concentric circles. Further, the second members 14a and 14b do not necessarily have a cylindrical shape, and may have a ring shape. The second members 14a and 14b may not be arranged at equal intervals in the circumferential direction, and may be arranged locally.

(Secondary Electron Emission Coefficient)

The secondary electron emission coefficient of the first member 13d. and those of the second members 14a and 14b are different. The secondary electron emission coefficients of the second members 14a and 14b are preferably greater than that of the first member 13d.

Figure 4:
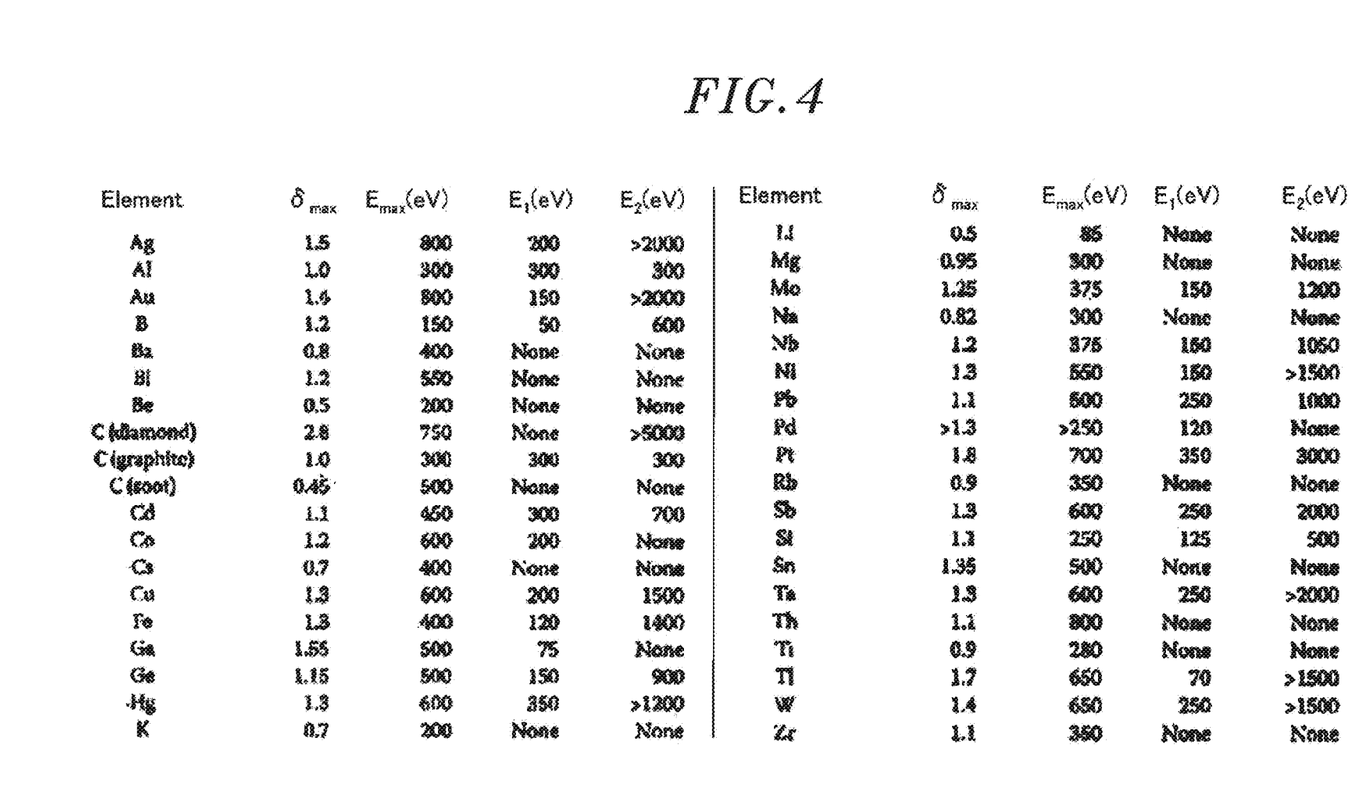
FIG. 4 shows a secondary electron emission coefficient (δmax) and the like of an element.
Figure 5:
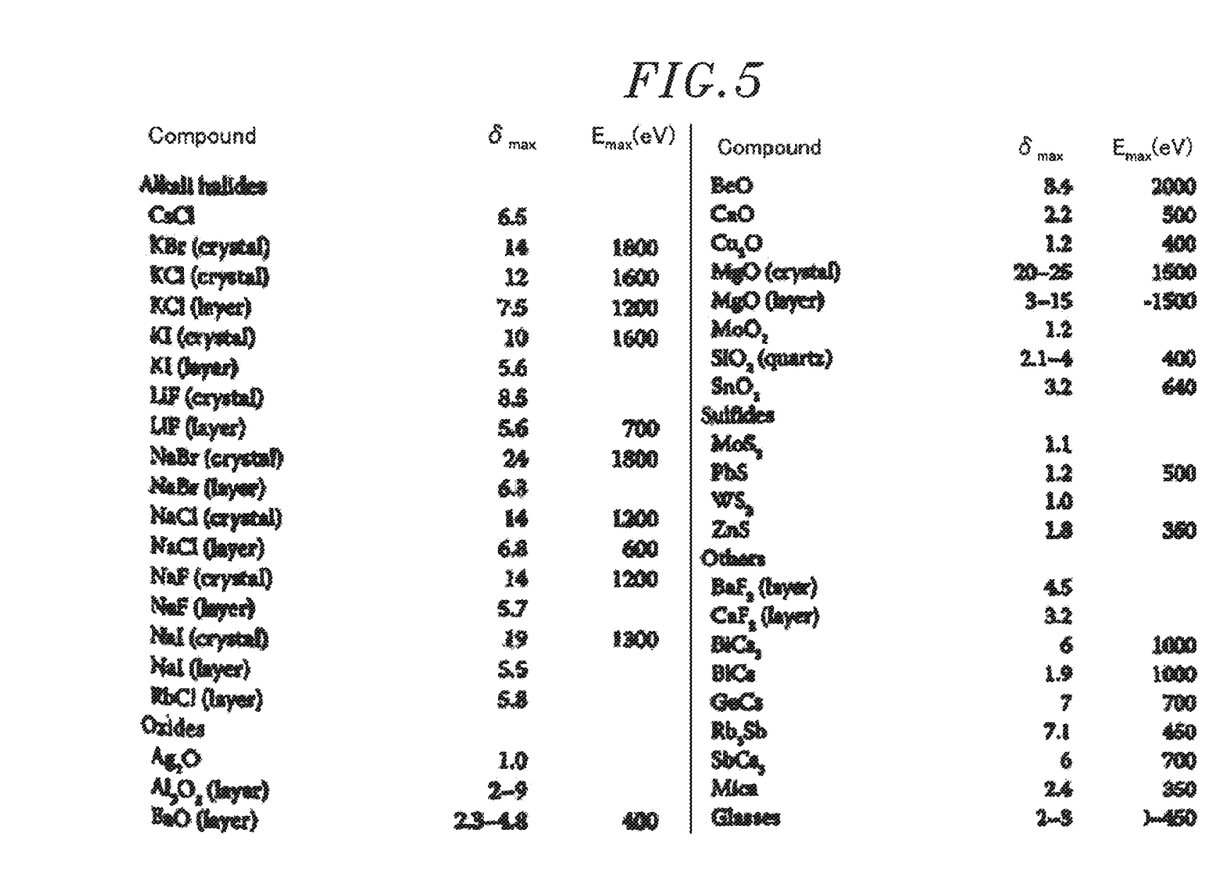
FIG. 5 shows a secondary electron emission coefficient (δmax) and the like or an element.

FIGS. 4 and 5 show the secondary electron emission coefficients ($\delta$max) and the like of elements or compounds, which are disclosed in "Hand book of chemistry and physic" of David R. Lide. The secondary electron emission coefficient ($\delta$max) of silicon (Si) that is an element shown on the right side of FIG. 4 is 1.1.

An element having a secondary electron emission coefficient greater than that of silicon may be quartz ($SiO_2$) that is a compound shown on the right side of FIG. 5. The secondary electron emission coefficient ($\delta$max) of quartz is 2.1 to 4, which is greater than that of silicon forming the second members 14a and 14b. Therefore, it is preferable to employ a combination of the first member 13d made of silicon and the second members 14a and 14b made of quartz.

The second members 14a and 14b may be made of magnesium oxide (MgO (crystal)) shown on the right side of FIG. 5. The secondary electron emission coefficient ($\delta$max) of magnesium oxide is 20 to 25, which is greater than that of silicon forming the second members 14a and 14b. Therefore, a combination of the first member 13d made of silicon and the second members 14a and 14b made of magnesium oxide may be employed.

The second members 14a and 14b may be made of alumina ($Al_2O_3$) shown on the left side of FIG. 5. The secondary electron emission coefficient ($\delta$max) of alumina is 2 to 9. Therefore, a combination of the first member 13d made of silicon and the second members 14a and 14b made of alumina may be employed.

The bottom surfaces of the first member 13d and the second members 14a and 14b are exposed to plasma In this case, ions in the plasma are incident on the bottom surfaces of the first member 13d and the second members 14a and 14b, so that electrons are emitted from the first member 13d and the second members 14a and 14b.

The amount of secondary electrons emitted from the first member 13d and the second members 14a and 14b is determined by the secondary electron emission coefficient. In other words, an element or compound having a larger secondary electron emission coefficient can emit a larger amount of secondary electrons when ions in the plasma are incident. On the other hand, single crystal silicon, SiC, and quartz are typical examples of a material used for the electrode plate 13e in consideration of plasma resistance or the like.

Therefore, in the plasma processing apparatus 1 of the present disclosure, silicon is used for the first member 13d mainly constituting the electrode plate 13e, and the second members 14a and 14b disposed in the first member 13d are made of quartz having a secondary electron emission coefficient greater than that of silicon. Accordingly, when a part of the electrode plate 13e is made of quartz, the emission amount of secondary electrons can be increased due to quartz having a secondary electron emission coefficient greater than that of silicon, compared to when the electrode plate 13e is made of only silicon.

Therefore, the second members 14a and 14b made of quartz are arranged in positions in the first member 13d made of silicon where an increase of a plasma electron density is desired. For example, when it is desired to increase the plasma electron density in the outer peripheral region, the second members 14a and 14b are arranged in the outer peripheral region of the first member 13d. Therefore, a larger number of electrons can be emitted from the bottom portion of the second members 14a and 14b than from the bottom portion of the first member 13d. Accordingly, the plasma electron density can be controlled, and the uniformity of the plasma density can be improved, which makes it possible to obtain the uniformity of the plasma processing of the substrate W.

(Plasma Electron Density)

Figure 6:
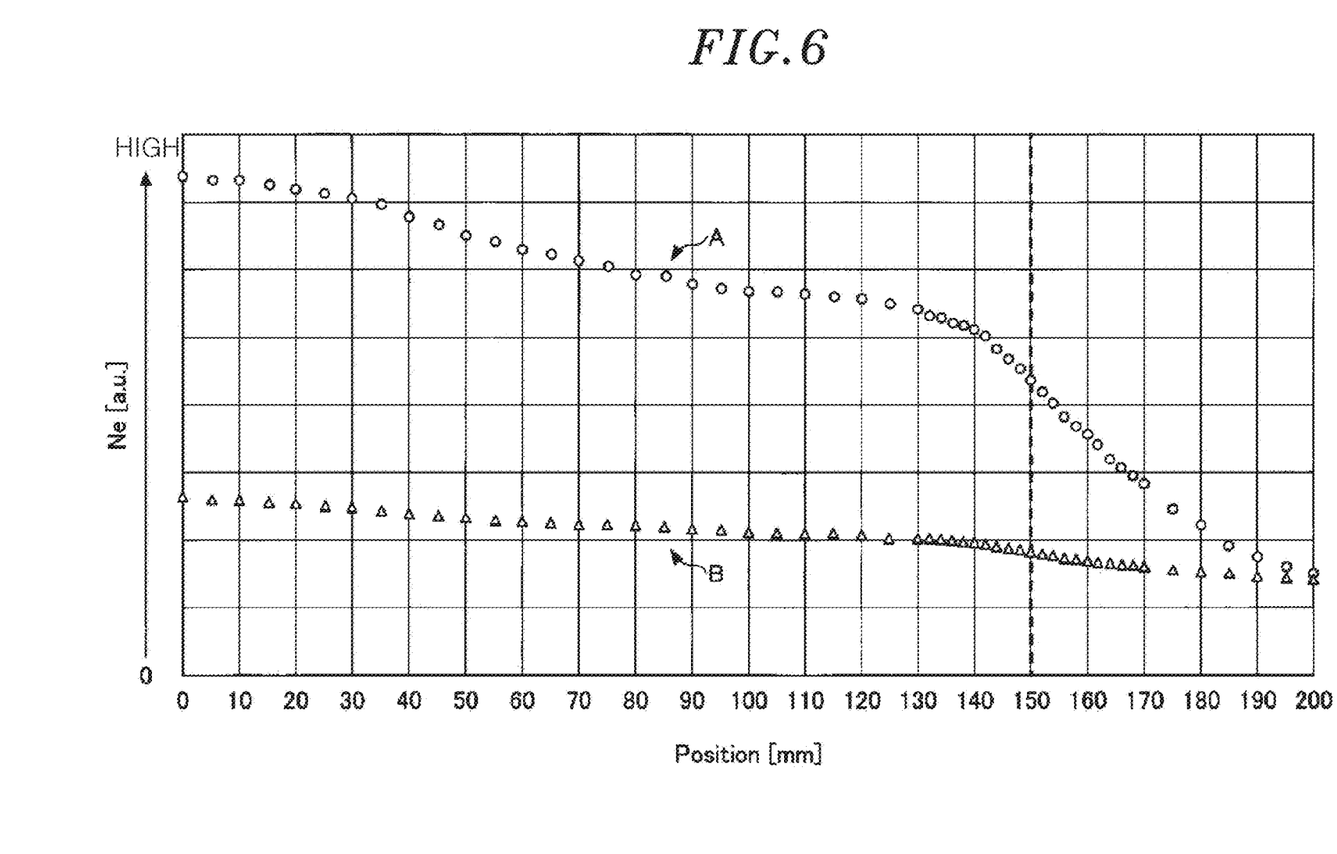
FIG. 6 shows examples of a plasma electron density in an embodiment and a comparative example.

FIG. 6 explains an example in which the second members 14a and 14b having a secondary electron emission coefficient greater than that of silicon of the first component 13d are arranged above a position where the plasma electron density in the plasma processing space 10s is relatively low. FIG. 6 shows an example of a plasma electron density in an embodiment and a comparative example.

In FIG. 6, the horizontal axis represents a radial position in the case where the center of the electrode plate 13e is set to 0, and the vertical axis represents a plasma electron density Ne. A position of 0 mm on the horizontal axis indicates the center of the substrate W, and a position of 150 mm on the horizontal axis indicates a position of an edge (outer peripheral end) of the substrate W. A curve "A" with an aggregate of circles (○) indicates a plasma electron density in the case where the first member 13d is an electrode plate made of only silicon.

The plasma electron density is determined by the structure of the substrate support 11 functioning as the lower electrode and an RF signal flowing through the substrate support. 11. The curve "A" in FIG. 6 indicates the plasma electron density in the case of producing plasma using the electrode plate having the first member 13d only made of silicon. In this case, the plasma electron density Ne shows mountain-shaped distribution with a peak at the center (0 mm) of the substrate W, and tends to be lowered near the position of about 150 mm corresponding to the edge of the substrate W.

Therefore, the second members 14a and 14b made of quartz having a secondary electron emission coefficient greater than that of silicon are arranged in the outer peripheral region including a position spaced apart from the center by a distance of about 150 mm. A curve "B" with an aggregate of triangles (△) indicates a plasma electron density in the case of generating plasma using the electrode plate 13e in which the second members 14a and 14b are arranged in the outer peripheral region of the first member 13d as shown in FIG. 3A of the present embodiment.

In this case, the plasma electron density in the outer peripheral region can be increased by the second members 14a and 14b having a secondary electron emission coefficient greater than that of the first member 13d, so that the uniformity of the plasma electron density can be obtained. Accordingly, the uniformity of the etching rate can be improved, and the uniformity of the plasma processing can be improved. In FIG. 6, the plasma electron density Ne is entirely lower in the curve "B" indicating the present embodiment than in the curve "A" indicating the comparative example. This is because the plasma generation conditions for obtaining the results of the curves "A" and "B" are different. If the plasma generation conditions are the same, the curves "A" and "B" may have the same plasma electron density Ne, and the uniformity of the plasma electron density can be obtained.

The above-described arrangement of the second members 14a and 14b is an example, and the arrangement of the second members 14a and 14b is not limited thereto. The second members having a secondary electron emission coefficient greater than that of the first member may be arranged in a region where the plasma electron density is relatively lower. For example, the second members may be arranged in a region where the plasma electron density is relatively lower. The amount of secondary electrons emitted from the bottom portion of the second member is relatively greater than the amount of secondary electrons emitted from the bottom portion of the first member, so that the uniformity of the plasma electron density Ne can be improved.

Although the example in which the bottom surfaces of the second members 14a and 14b are exposed to the plasma processing space 10s has been described, the second members 14a and 14b may not be exposed to the plasma processing space 10s. For example, when the second members 14a and 14b are exposed to the through-holes having the gas inlet ports 13c (see FIG. 1) of the electrode plate 13e, electrons may enter the through-holes and collide with the second members, which may result in emission of secondary electrons from the second members. In this case, the bottom surfaces of the second members 14a and 14b are not necessarily exposed to the plasma processing space 10s.

However, if plasma enters the through-holes, abnormal discharge may occur in the through-holes. Therefore, the dimensions of the through-holes are controlled to prevent the plasma from entering the through-holes. Further, if a gap of a predetermined dimension or larger exists between the first member 13d and the second members 14a and 14b, secondary electrons are emitted through the gap. When plasma enters the gap, abnormal discharge occurs in the gap. Therefor the dimension of the gap is controlled to prevent the plasma from enter the gap between the first member 13d and the second members 14a and 14b.

As described above, the electrode for the plasma processing apparatus of the present embodiment includes the conductive first member, and the second members disposed in the first member and made of a material having a secondary electron emission coefficient different from that of the first member. In accordance with the electrode for the plasma processing apparatus and the plasma processing apparatus 1 configured as described above, the plasma electron density can be controlled. Accordingly, the uniformity of the plasma electron density can be achieved. Hence, the uniformity of the plasma processing can be improved.

In the present disclosure, the upper electrode has been described as an example of the electrode for the plasma processing apparatus. However, the electrode for the plasma processing apparatus is not limited thereto, and may be a member disposed at an upper portion of the plasma processing chamber 10. For example, the electrode for the plasma processing apparatus may be the annular ground member 16 disposed at an upper portion of the plasma processing chamber 10. In this case, the ground member 16 has the first conductive member and the second members disposed in the first member and having a secondary electron emission coefficient different from that of the first member. Therefore, it is possible to control the plasma electron density mainly in the outer peripheral region of the substrate W. Accordingly, the plasma electron density near the sidewall 10a of the plasma processing chamber 10 can be increased. Hence, in the case of generating plasma by supplying a cleaning gas to the plasma processing space 10s, a cleaning effect can be improved near the sidewall 10a, so that a location that is not cleaned conventionally may be cleaned.

The ground member 16 is disposed below the insulating member 15 and is grounded. The electrode for the plasma processing apparatus of the present disclosure may be applied to both the upper electrode and the ground member 16.

The electrode for a plasma processing apparatus and the plasma processing apparatus according to the embodiments of the present disclosure are considered to be illustrative in all respects and not restrictive. The above-described embodiments can be changed and modified in various forms without departing from the scope of the appended claims and the gist thereof. The above-described embodiments may include other configurations without contradicting each other and may be combined without contradicting each other.

The plasma processing apparatus of the present disclosure may be any type of apparatus such as an atomic layer deposition (ALD) apparatus, a capacitively coupled plasma (CCP) processing apparatus, an inductively coupled plasma (ICP) processing apparatus, an apparatus using a radial line slot antenna (RLSA), an electron cyclotron resonance plasma (ECR) processing apparatus, and a helicon wave plasma (HWP) processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and chances in the form of the embodiments described herein may be made without departing from the spirit of the disclosures. The accompanying claims and their equivalents are intended to cover such forms or modifications as would fall within the scope and spirit of the disclosures.

The invention claimed is:

1. An electrode for a plasma processing apparatus, comprising: a first member that is conductive; and a second member disposed in the first member and made of a material having a secondary electron emission coefficient different from a secondary electron emission coefficient of the first member; wherein the second member is disposed only in an outer peripheral area, and wherein the first member is radially divided into an inner peripheral area, and intermediate area, and the outer peripheral area, in that order from a center of the first member.

2. The electrode for a plasma processing apparatus of claim 1, wherein the second member is configured such that a surface of the second member is at least partially exposed to plasma.

3. The electrode for a plasma processing apparatus of claim 1, wherein the secondary electron emission coefficient of the second member is greater than the secondary electron emission coefficient of the first member.

4. The electrode for a plasma processing apparatus of claim 3, wherein there are a plurality of second members disposed in the first member.

5. The electrode for a plasma processing apparatus of claim 4, wherein the plurality of second members are arranged at equal intervals.

6. The electrode for a plasma processing apparatus of claim 4, wherein the plurality of second members are arranged at equal intervals in a circumferential direction.

7. The electrode for a plasma processing apparatus of claim 1, wherein the first member is made of silicon and the second member is made of quartz.

8. The electrode for a plasma processing apparatus of claim 1, wherein the second member is configured such that a surface of the second member is at least partially exposed from a surface of the first member exposed to plasma and is not exposed from another surface of the first member opposite to the surface exposed to the plasma.

9. The electrode for a plasma processing apparatus of claim 1, wherein the second member is configured such that the second member penetrates through the first member in a height direction, and a surface of the second member is at least partially exposed from a surface of the first member exposed to plasma and another surface of the first member opposite thereto.

10. The electrode for a plasma processing apparatus of claim 1, wherein the second member has a cylindrical shape with a stepped portion, and
an upper diameter of the cylindrical shape is greater than a lower diameter of the cylindrical shape.

11. The electrode for a plasma processing apparatus of claim 1,
wherein the second member has a cylindrical shape with a stepped portion, and
an upper diameter of the cylindrical shape is smaller than a lower diameter of the cylindrical shape.

12. A plasma processing apparatus comprising: a plasma processing chamber; a substrate support disposed in the plasma processing chamber; and an electrode disposed to face the substrate support, wherein the electrode includes: a first member that is conductive; and a second member disposed in the first member and made of a material having a secondary electron emission coefficient different from a secondary electron emission coefficient of the first member; wherein the second member is disposed only in an outer peripheral area, and wherein the first member is radially divided into an inner peripheral area, and intermediate area, and the outer peripheral area, in that order from a center of the first member.

* * * * *